United States Patent [19]

Lock et al.

[11] Patent Number: 4,861,085

[45] Date of Patent: Aug. 29, 1989

[54] PIN TRANSFER APPARATUS

[75] Inventors: Brian E. Lock, Princeton; John G. Aceti, Princeton Junction, both of N.J.

[73] Assignee: General Electric Company, Schenectady, N.Y.

[21] Appl. No.: 151,291

[22] Filed: Feb. 1, 1988

[51] Int. Cl.$^4$ .......................... B25B 11/00; B65H 5/14
[52] U.S. Cl. ................................ 294/87.1; 294/103.1; 294/87.26; 29/281.5; 29/759; 221/93
[58] Field of Search ....................... 29/281.5, 283, 464, 29/757, 758, 759, 771; 273/241, 264, 281; 269/54.5, 309, 900; 221/93, 94, 99, 101; 294/87.1, 86.4, 103.1, 87.26

[56] References Cited

U.S. PATENT DOCUMENTS

| | | | |
|---|---|---|---|
| 1,012,192 | 12/1911 | Corkery | 294/87.1 X |
| 2,240,717 | 2/1939 | Read | 294/87.26 X |
| 2,778,670 | 7/1953 | Friedman | 294/87.26 |
| 2,947,444 | 1/1956 | Taylor et al. | 221/93 |
| 3,501,151 | 11/1967 | Ketchum | 273/281 X |
| 4,102,043 | 7/1978 | Andrade et al. | 29/757 X |

*Primary Examiner*—Robert B. Reeves
*Assistant Examiner*—Dean J. Kramer
*Attorney, Agent, or Firm*—Ernest F. Chapman

[57] ABSTRACT

An apparatus for transferring headed pins includes a frame having a pair of spaced, parallel side rails and an end plate secured between the side rails at one end thereof. A pair of plates are secured together and connected between the side rails at the other ends thereof. The pair of plates have at least a portion of their opposed surfaces spaced from each other, and have aligned holes therethrough for receiving the pins to be transferred. A third plate having openings therethrough is slidable in the space between the pair of plates. An operating rod is connected to the third plate and can move the third plate between a first position in which the holes in the third plate are aligned with the holes in the pair of plates, and a second position in which the holes in the third plate only partially overlap the holes in the pair of plates. With the third plate in its second position, pins can be inserted through the holes and will not pass completely therethrough so that they will be held in the apparatus. When the third plate is moved to its first position, the pins are free to pass completely through the holes so that they can be transferred to another apparatus.

7 Claims, 2 Drawing Sheets

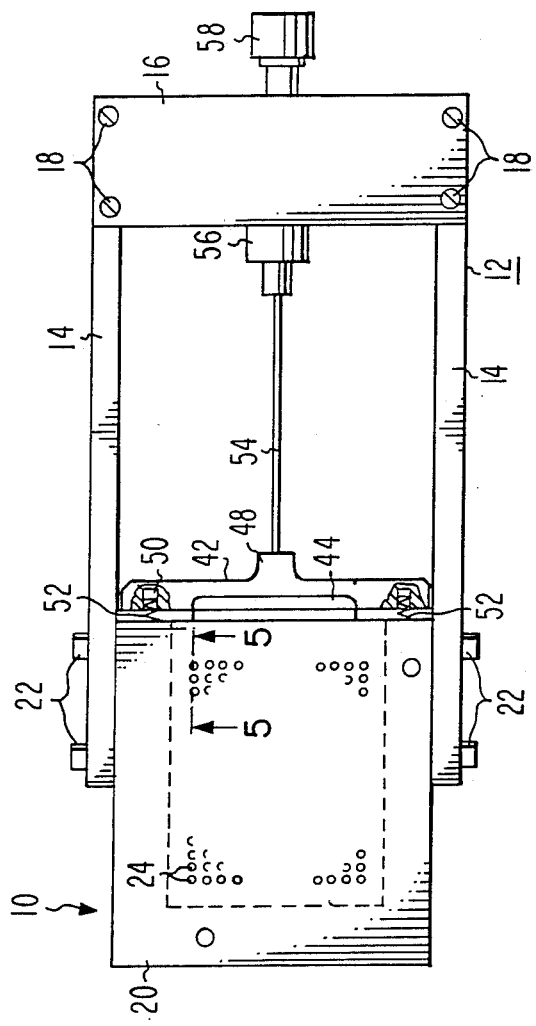
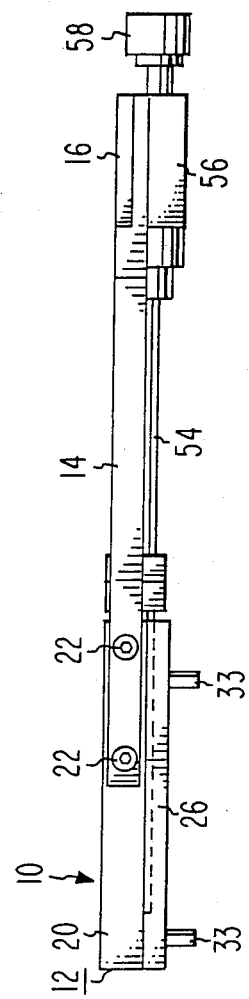
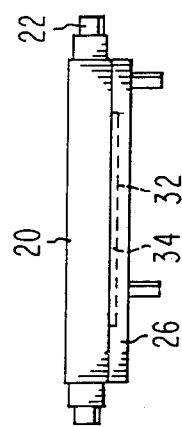
Fig. 1
Fig. 2
Fig. 3

PIN TRANSFER APPARATUS

FIELD OF THE INVENTION

The present invention relates to a pin apparatus, and, more particularly, to an apparatus for transferring a plurality of headed pins arranged in a desired pattern into a heated mold.

BACKGROUND OF THE INVENTION

Integrated circuit elements are generally mounted on a support which includes a body of an insulating material having a plurality of terminal pins molded in the body and projecting therefrom. The number of pins and their arrangement depends on the number and arrangement of the contact pads on the integrated circuit element. The number of pins required may be at least twelve and generally many more. The support is generally formed by placing the pins, which have a head on one end, into appropriate holes in a heated mold with the heads of the pins extending into the cavity for molding the body. The body is then molded around the heads of the pins either by compression or injection molding. Heretofore, the pins have been loaded into the mold manually. This is not only dangerous to the operator since the mold is very hot, but also individually inserting a large number of relatively small pins into the mold is a time consuming and therefore expensive operation. Therefore, it would be desirable to have an apparatus by which the pins can be inserted in the mold quickly and without endangering the operator.

SUMMARY OF THE INVENTION

An apparatus for transferring a plurality of pins includes a pair of plates secured together with at least a portion of their opposed surfaces being in spaced relation. The pair of plates have a plurality of aligned openings therein. A third plate slidably fits between the pair of plates and includes a plurality of openings therethrough. Operating means is attached to the third plate for selectively moving the third plate between a position in which the holes therethrough are aligned with the holes in the pair of plates, and a position in which the holes in the third plate are slightly out of alignment with the holes in the pair of plates.

BRIEF DESCRIPTION OF THE DRAWINGS

FIG. 1 is a top view of the transfer apparatus of the present invention.

FIG. 2 is a side view of the transfer apparatus.

FIG. 3 is an end view of the transfer apparatus.

DETAILED DESCRIPTION OF PREFERRED EMBODIMENT

Figure 4:
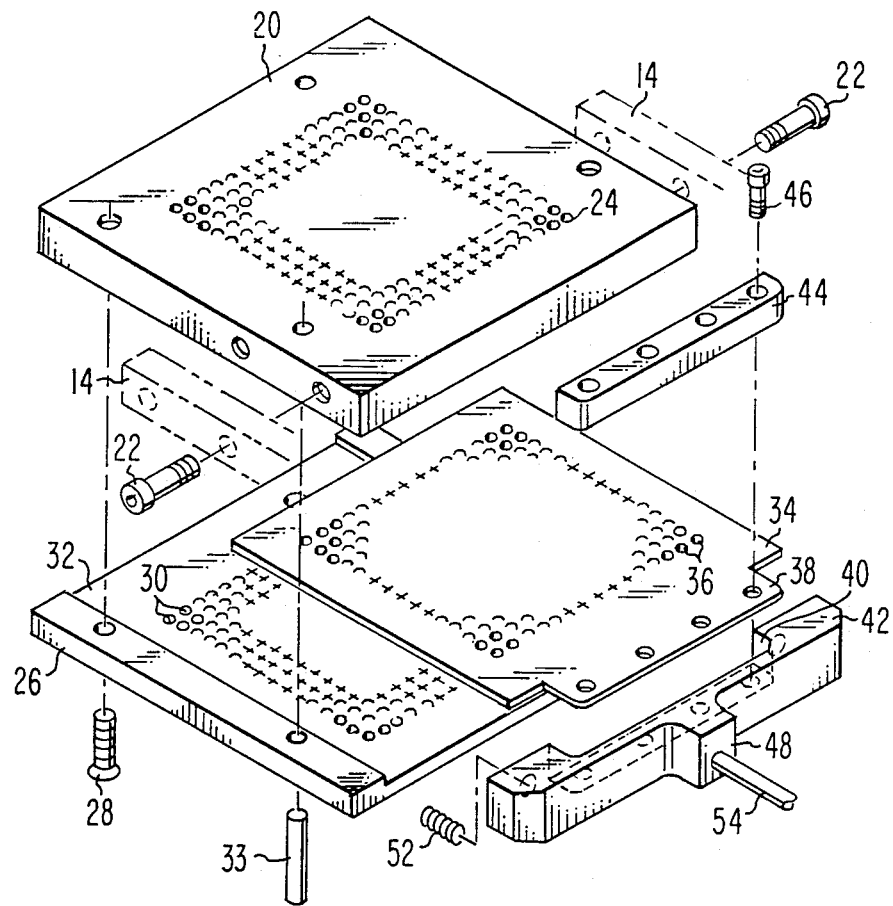
FIG. 4 is an exploded perspective view of the plates of the transfer apparatus.

Referring to FIGS. 1-3, the transfer apparatus of the present invention is generally designated as 10. Transfer apparatus 10 includes a support frame 12 having a pair of side rails 14 held in spaced, parallel relation by an end plate 16 secured to one end portion of the side rails by screws 18. A flat, rectangular top plate 20 fits between the side rails 14 at the other ends thereof, and is secured to the side rails 14 by screws 22 extending through the side rails 14 and threaded into the side edges of the top plate 20. The top plate 20 has a plurality of holes 24 therethrough. As shown in FIG. 1, the holes 24 are arranged in a pattern of a plurality of rectangles around each other.

A flat, rectangular bottom plate 26 is mounted across the bottom surface of the top plate 20 and is secured to the top plate 20 by screws 28 (See FIG. 4). The bottom plate 26 has a plurality of holes 30 therethrough which are arranged so that each hole 30 in the bottom plate 26 is aligned with a hole 24 in the top plate 20. The bottom plate 26 has a recess 32 in its surface which faces the top plate 20. The recess 32 is of a width wider than the pattern of the holes 30 and extends completely along the bottom plate 26 from one end of the bottom plate 26 to the other. A pair of alignment pins 33 project from the bottom surface of the bottom plate 26.

As shown in FIG. 4, a thin, flat, rectangular clamping plate 34 slidably fits within the recess 32 in the bottom plate 26. The clamping plate 34 has a plurality of holes 36 therethrouhh which are arranged in a rectangular pattern so as to form rows and columns. The clamping plate 34 has a flange 38 extending from its end toward the end plate 16 of the support frame 12. The flange 38 fits in a recess 40 in a clamp 42. A bar 44 is within the recess 40 over the flange 38. Screws 46 extend through holes in the bar 44 and flange 38 and are threaded into the clamp 42 so that the flange 38 is secured between the clamp 42 and the bar 44. Thus, the clamping plate 34 is secured to the clamp 42. A cylindrical hub 48 projects from the side of the clamp 42 which faces the end plate 16 of the frame 12. The clamp 42 has a pair of recesses 50 in its side which faces the clamping plate 34, one at each side of the flange 38. A spring 52 is in each of the recesses 50 and is compressed between the clamp 42 and the adjacent edge of the top plate 20 so as to normally push the clamp 42 away from the top plate 20.

An operating rod 54 has one end secured in a recess in the hub 48 and extends away from the clamp 42 substantially parallel to the side rails 14 of the frame 12. The rod 54 extends through and is slidably supported in a bearing bushing 56 secured to the bottom of the end plate 16 of the frame 12. The rod 54 extends beyond the bearing bushing 56 and has a knob 58 on its end.

In the operation of the transfer apparatus 10, the clamping plate 34 is slidable by the operating rod between a first position in which the holes 36 in the clamping plate 34 are in complete alignment with the holes 24 and 30 in the top plate 20 and bottom plate 26 respectively, and a second position in which the clamping plate holes 34 only partially overlap the top and bottom plate holes 24 and 30. The springs 52 normally push the clamp 42 and top plate 20 apart to place the clamping plate 34 in the second position. By pushing in on the knob 58 the clamping plate 34 can be slid to the first position.

Figure 5:
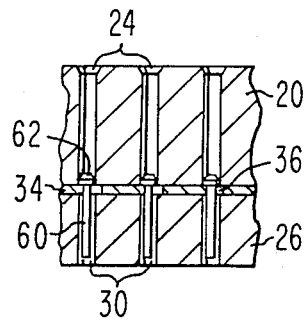
FIG. 5 is a sectional view taken along line 5—5 of FIG. 1 showing, the position of the plates to hold pins in the apparatus.
Figure 6:
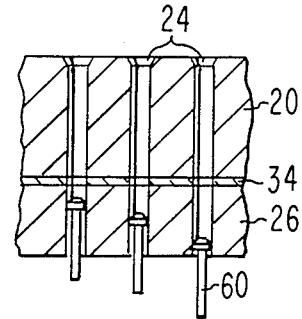
FIG. 6 is a sectional view similar to FIG. 5 showing the position of the plates to allow pins to drop out of the apparatus.

With the clamping plate 34 in the second position, the ends of headed terminal pins 60 are inserted in appropriate holes 24 in the top plate 20. The terminal pins 60 will pass through the overlapping portion of the clamping plate hole 36 and then through the aligned bottom plate hole 30. However, when the head 62 of the pin 60 passes through the top plate hole 24, it is too large to pass through the overlapping portion of the clamping plate hole 36. Thus, the head 62 will become seated on the clamping plate 34 as shown in FIG. 5. The number of terminal pins 60 and the hole positions in which they are inserted depends on the number and arrangement of the pins 60 desired for the support body being molded. The pins 60 may be inserted manually, or by an appropriate insertion machine. When all of the desired pins 60 are inserted in the top plate 20, the transfer apparatus 10 is carried to the mold and placed on the bottom mold plate with the alignment pins 33 inserted into corresponding alignment holes in the mold plate. This aligns the terminal pins 60 with the pin receiving holes in the mold cavity. The knob 58 is then pressed inwardly to move the clamping plate 34 to its first position. With the clamping plate holes 36 now being completely aligned with the top and bottom plate holes 24 and 30, as shown in FIG. 6, the pin heads 62 can pass completely through the holes 24, 36 and 30 so that all of the pins 60 will drop into the mold cavity. Since the holes in the mold cavity are generally smaller than the holes 24, 30 and 36 in the plates 20, 26 and 34 respectively, a vibrator may be placed on the top plate 20 to vibrate the pins 60 and ensure that they fall into the holes in the mold cavity.

When the knob 58 is released, the springs 52 will move the clamping plate 34 back to its second position so that the transfer apparatus 10 can be reloaded with the terminal pins 60.

Thus, there is provided by the present invention a transfer apparatus 10 which can be loaded with any desired number of terminal pins 60 in any desired arrangement of the pins. The transfer apparatus 10 will then hold the pins 60 while the transfer apparatus is moved to a mold. Once in the mold, the transfer apparatus 10 will simultaneously release all of the pins into the mold cavity quickly and easily. In addition, the transfer apparatus 10 can be placed in the mold to transfer the pins 60 to the mold without endangering the operator who does not have to place his hand within the mold to accomplish the transfer of the pins.

We claim:

1. An apparatus for transferring a plurality of headed pins comprising:

a frame having spaced, parallel side rails and an end plate connected between said side rails at one end thereof;

a pair of plates secured together with at least portions of opposed surfaces being in spaced, parallel relation, said plates having aligned holes therethrough, the pair of plates being secured between said side rails adjacent the other ends of the side rails;

a third plate slidably fitting between said pair of plates and having holes therethrough; and means attached to the third plate for selectively moving said third plate with respect to the pair of plates between a first position in which the holes in the third plate are aligned with the holes in the pair of plates, and a second position in which the holes in the third plates only partially overlap the holes in the pair of plates.

2. An apparatus in accordance with claim 1 in which one of said pair of plates has a recess therein extending from one end of the pair of plates to the other end, and the third plate is in said recess.

3. An apparatus in accordance with claim 2 including an operating rod connected to one end of the third plate and slidably supported on the end plate for moving the third plate between its two positions.

4. An apparatus in accordance with claim 3 including a clamp connected to said one end of the third plate, the operating arm is connected to said clamp, and spring means is between said clamp and one of said pair of plates for normally holding the third plate in its second position.

5. An apparatus in accordance with claim 4 in which said third plate has a flange extending from said one end, said flange fitting into a recess in the clamp and a bar is in the recess over the flange and is secured to the clamp to secured the flange to the clamp.

6. An apparatus in accordance with claim 5 including a bearing bushing secured to the end portion of the frame, and the operating rod extends through and is supported in the bearing bushing.

7. An apparatus in accordance with claim 6 including a knob on the end of the operating rod.

* * * * *